United States Patent [19]

Hazano et al.

[11] Patent Number: 4,693,777
[45] Date of Patent: Sep. 15, 1987

[54] APPARATUS FOR PRODUCING SEMICONDUCTOR DEVICES

[75] Inventors: Shigeki Hazano, Yokohama, Japan; Masahiro Shibagaki, San Jose, Calif.; Hidetaka Jyo; Reiichiro Sensui, both of Sagamihara, Japan; Munenori Iwami, Yokohama, Japan; Noboru Suzuki, Chigasaki, Japan

[73] Assignees: Kabushiki Kaisha Toshiba, Kawasaki; Kabushiki Kaisha Tokuda Seisakusho, Zama, both of Japan

[21] Appl. No.: 802,468

[22] Filed: Nov. 27, 1985

[30] Foreign Application Priority Data

| Nov. 30, 1984 | [JP] | Japan | 59-253581 |
| Nov. 30, 1984 | [JP] | Japan | 59-253582 |
| Nov. 30, 1984 | [JP] | Japan | 59-253585 |
| Nov. 30, 1984 | [JP] | Japan | 59-253589 |
| Nov. 30, 1984 | [JP] | Japan | 59-253591 |

[51] Int. Cl.$^4$ .................... B44C 1/22; C23F 1/02; C03C 15/00
[52] U.S. Cl. .................... 156/345; 118/50; 118/728; 134/105; 156/643; 156/646; 204/298
[58] Field of Search .......... 156/345, 643, 646, 651, 156/656, 659.1, 665; 134/1, 102, 105, 201; 204/192 EC, 192 E, 298; 118/50, 50.1, 728–730, 620

[56] References Cited

U.S. PATENT DOCUMENTS

| 4,477,311 | 10/1984 | Mimura et al. | 156/345 |
| 4,487,678 | 12/1984 | Noguchi et al. | 204/298 |

FOREIGN PATENT DOCUMENTS

| 57-13743 | 1/1982 | Japan | 156/643 |
| 57-23228 | 2/1982 | Japan | 156/345 |
| 58-56336 | 4/1983 | Japan | 156/345 |
| 0101478 | 6/1983 | Japan | 156/643 |
| 0196063 | 11/1983 | Japan | 156/643 |

Primary Examiner—William A. Powell
Attorney, Agent, or Firm—Schwartz, Jeffery, Schwaab, Mack, Blumenthal & Evans

[57] ABSTRACT

An apparatus for producing semiconductor devices in which a plurality of treatment chambers such as a load chamber, an etching chamber, a sputtering chamber, an ion implantation chamber, a CVD chamber, an unload chamber, a transfer chamber, a heat-treatment chamber, a rinsing chamber and the like, are connected in series preferably in the form of U for effecting various treatments of semiconductor wafers. Wafer conveyor and transfer means are provided to move a wafer through the treatment chambers in which the wafer is normally sequentially processed and these conveyor and transfer means are reversible so that a wafer which has been moved into a predetermined treatment chamber can be returned to the inlet of the apparatus, whereby the quantity of dust attached to the wafer in each treatment chamber can be easily and positively detected. In the heat-treatment chamber, the hot air is discharged against the upper surface of the wafer on the belt conveyor while a vertically movable heating plate is brought into contact with the undersurface of the wafer so that the uniform heat-treatment can be accomplished within a short period of time. Furthermore, the inner surfaces of the etching chamber or the like are lined with detachable linings made of, for instance, aluminum so that maintenance is facilitated.

49 Claims, 12 Drawing Figures

APPARATUS FOR PRODUCING SEMICONDUCTOR DEVICES

BACKGROUND OF THE INVENTION

The present invention relates to an apparatus for producing semiconductor devices by, for example, etching, heating and rinsing materials to be treated such as semiconductor wafers.

In the case of etching aluminum layers on wafers or materials to be treated, chloride gases such as $SiCl_4$, $CCl_4$, $BCl_3$, $Cl_2$ have been generally used. Etching proceeds by the chemical reactions of Al with these etching gases. In the case of a sheet type etching process in which wafers are processed or etched one at a time, an etching chamber must be always maintained in a vacuum state in order to prevent corrosion by chlorine produced by the chemical reactions of water in the atmospheric air with the etching gases.

Furthermore, after the etching process, when the etched wafers are exposed to the surrounding atmosphere, corrosion occurs so that the etched wafers are subjected to the heat-treatment or water rinsing, thereby removing residual chloride compounds.

However, in the prior art apparatus for producing semiconductor devices, an etching unit is disposed independently of post-treatment units so that a large space is required for the installation of the whole apparatus for producing semiconductor devices. Furthermore, the etched wafers are corroded because it takes a long period of time to transfer the etched wafers from the etching unit to the post-treatment unit.

Recently, a fully automatic apparatus for producing semiconductor devices has been developed so that a wafer is automatically transferred through a plurality of treatment chambers for various treatments in a vacuum from a load cassette to an unload cassette without requiring any manual handling of wafers, whereby the treatment time is shortened and the attachment of dust or contaminants on the wafers is avoided.

However, with the apparatus of the type just described above, when wafers are contaminated with dust, abnormal etching results so that the reliability and yield of the finished wafers are decreased. It is believed that dust is introduced because of the friction between moving parts of the apparatus, foreign matter entrained in the gases introduced and the products of chemical reactions. Therefore it becomes very important to find out where wafers which are transferred through a plurality of treatment chambers are contaminated with dust.

However, in the case of the prior art apparatus for producing semiconductor devices, it is only possible to detect the quantity of dust attached to a wafer only after this wafer has been discharged out of the last one of a plurality of treatment chambers. That is, it has been impossible to detect the quantity of dust attached to a wafer in one particular treatment chamber.

In the case of the prior art etching devices employing fluoride etching gases, when the etched wafer is discharged out of the etching device, corrosion of the wafer occurs because of the chemical reactions between the oxygen in the surrounding atmosphere and the chloride etchant such as $AlCl_3$ still remaining on the wafer.

In order to overcome this problem, there has been proposed an apparatus for producing a semiconductor device in which a cassette holding a plurality of etched wafers is placed into an electric furnace or a case with an industrial dryer so that the etched wafers are subjected simultaneously to the heat treatment process.

Figure 1:
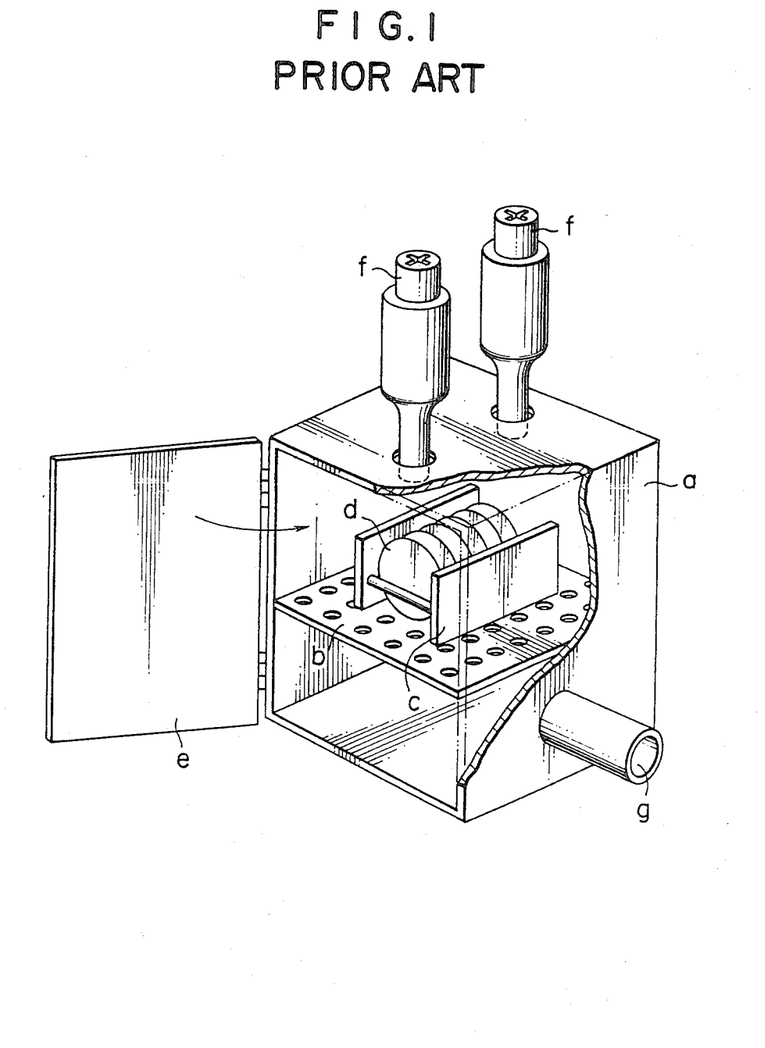
FIG. 1 is a perspective view of a prior art heat-treatment chamber.

More specifically, as shown in FIG. 1, a partition plate b formed with a plurality of holes is disposed in a case a so that the case a is divided into an upper chamber and a lower chamber. A cassette c holding a plurality of wafer d is placed upon the partition plate b and the case a is air-tightly closed with a cover e. The wafers d are dried by the hot air discharged from dryers f disposed on the top of the case a and the hot air flows through the holes of the partition plate b and then is discharged through a discharge port g formed at a lower portion of one side wall of the case a into the surrounding atmosphere.

With the device of the type just described above, some portions of wafers are not sufficiently heated because of the cassette c so that it takes a long period of time before the cassettes d are elevated to a predetermined temperature. Furthermore, there is the problem that the wafers d are not uniformly heated so that the variations in properties of wafers result in the post-treatment processes.

Furthermore the device of the type described above is of the batch type because the cassette c holding a plurality of wafers d is placed into the device. However, such a batch type heat-treatment device cannot be directly connected to an etching device.

Meanwhile, recently in the production of semiconductor devices, there has been a strong increasing demand for a higher packaging density and a higher rate of production. Therefore, there has been employed a reactive ion etching process which can etch extremely fine elements and can obtain the vertical side walls without undercuts.

For instance, in the case of etching aluminum which has been widely used as a material for defining conduction paths between electrodes, the chloride gases are used. That is, a semiconductor wafer is charged placed into a reaction vessel and then the reaction vessel is evacuated so that the glow discharge is produced in the reaction gas atmosphere. Then the reaction between a material to be etched on the wafer and the etching gases proceeds so that the material to be etched is changed into a volatile chemical compound. In this manner, the etching process proceeds.

When the etching process is completed and the etched wafer is discharged from the reaction vessel into the surrounding atmosphere, the etched wafer still includes the etching gases. As a result, the chemical reactions proceed between these remaining etching gases and the water in the surrounding air so that a conductor pattern of the material not etched and remaining on the wafer is connected to another conductor pattern. As a consequence, the conductor paths are broken and short-circuited.

It follows therefore that it is imperative to remove the reaction gases still remaining on the etched wafer immediately after the completion of the etching cycle. This process can be very effectively accomplished by blowing the hot air against the etched wafer and/or heating the etched wafer. Therefore, the etched wafers are heated in an electric furnace or by an industrial dryer, but such heating takes a long period of time to heat the etched wafer to a predetermined temperature; a uniform temperature distribution cannot be attained so that the properties of the heat-treated wafer vary; and it takes a long period of time before the etched wafer is subjected to the heat-treatment.

In order to overcome the above and other problems, there has been proposed a heat-treatment device which can be directly connected to an etching device. A wafer etched in the etching device is immediately transferred by a conveyor or the like from the etching device into the heat-treatment chamber in which the transferred wafer is immediately subjected to the heat-treatment process by means of a normally heated heating plate and an air-heating device. However, since the conveyor or the like is extended into the heat-treatment chamber, a drive means for driving such conveyor or the like from the exterior of the heat-treatment chamber is needed. Therefore, a power transmission means must interconnect between the exterior driving means and the conveyor or the like in the heat-treatment chamber through a hole formed through one side wall thereof. As a result, the hot gases are discharged out of the heat-treatment chamber through this hole into the surrounding atmosphere so that the operations of various devices disposed adjacent to the heat-treatment chamber are adversely affected by the temperature rise. Furthermore, corrosion of these peripheral devices results because the discharged gases contain the reaction or etching gases.

Therefore, it may be proposed to dispose the complex driving means for driving the conveyor or the like within the heat-treatment chamber. However, it is impossible to do so because the driving means is exposed to high temperatures and the reaction gases within the heat-treatment chamber causing corrosion of the driving means. As a consequence, the driving means must be minimized as much as possible and the conveyor system or the like must be simplified as much as possible. Therefore, a belt conveyor is employed. Since a wafer is transported by the belt conveyor, it cannot come into direct contact with a heating plate. As a result, the wafer heating efficiency is considerably low, and positive and fast heat-treatment cannot be accomplished.

In the RIE device (Reactive Ion Etching device) which is one of the types of plasma etching devices, a pair of parallel electrodes are disposed within a vacuum vessel into which an etching gas is introduced, and a wafer is securely held in position on one of the electrodes. RF power is applied to one of the electrodes so that the plasma is produced, whereby the wafer is etched.

However, when the vacuum vessel is made of stainless steel and a chloride etching gas is introduced into the vacuum chamber, iron, nickel and chromium are discharged out of the vacuum vessel so that the wafer is contaminated and the properties or characteristics of the wafer are considerably degraded.

In order to overcome the above problem, the vacuum vessel is made of alumina or the inner aluminum surfaces of the vacuum vessel are oxidized. However, since alumina is very expensive and has low strength, it is not preferable to use it to fabricate a vacuum chamber.

Furthermore, the commpounds resulting from the etching process tend to attach themselves to the inner surfaces of the vacuum chamber so that in order to prevent the adverse effects of such compounds on the wafer, the interior of the vacuum chamber must be frequently cleaned. However, with the prior art vacuum vessels, cleaning and maintenance are difficult.

SUMMARY OF THE INVENTION

A first object of the present invention is to provide an apparatus for produoing semiconductor devices in which the post-treatments of materials to be treated can be immediately effected and which has a high degree of space efficiency.

A second object of the present invention is to provide an apparatus for producing semiconductor devices in which the quantity of dust attached to a material to be treated in each treatment chamber can be easily and positively detected.

A third object of the present invention is to provide an apparatus for producing semiconductor devices provided with a heat-treatment chamber which can uniformly heat a material to be treated within a short period of time; which is provided with a transport means; and which can be connected to an etching device so that materials to be treated can be automatically and continuously treated.

A fourth object of the present invention is to provide an apparatus for producing semiconductor devices provided with a heat-treatment device capable of uniform heat-treatment at an extremely high rate.

The above and other objects of the present invention can be attained by an apparatus for producing semiconductor devices comprising: a dry etching unit for dry etching a material to be treated, said dry etching unit having an etching chamber in which said material to be treated is etched, an electrode for applying RF power to said material to be treated which is securely held in position and a gas introduction means for introducing etching gases into said etching chamber; a heat-treatment unit having a contact heating means for making substantial contact with at least one surface of said material etched in said dry etching unit to thereby heat said material under atmospheric pressure; and a transport means for transferring said material to be treated from said dry etching unit to said heat-treatment unit, said transport means connected to said dry etching unit and said heat-treatment unit.

The above and other objects of the present invention are also attained by an apparatus for producing semiconductor devices comprising: a plurality of treatment chambers for continuously and sequentially effecting various treatments on a material to be treated; said plurality of treatment chambers being arranged in order of treatment; and a conveyor means for transporting said material to be treated through said plurality of treatment chambers in one direction or in the opposite direction, whereby said material to be treated which has been transported in one direction by said conveyor means through part of said plurality of treatment chambers can be transported in the opposite direction through said part of plurality of treatment chambers without treatments, so that said material on which only part of said plurality of sequential treatments has been effected can be taken out from the inlet of said plurality of treatment chambers.

The above and other objects of the present invention can be further attained by an apparatus for producing semiconductor devices comprising: a dry etching unit for dry etching a material to be treated; and a heat-treatment unit communicating with said dry etching unit, said heat-treatment unit having a case whose opposing side walls are formed with an inlet for said material to be treated and an outlet for said treated material, a transporting means for transporting said material to be treated from said inlet to said outlet of said case, and a heating means disposed adjacent to said transporting means for heating under atmospheric pressure said material which is transported by said transporting means, said heating means having a contact heating means for making substantial contact with at least one surface of the material.

The above and other objects of the present invention can be further attained by an apparatus for producing semiconductor devices comprising: an etching unit for dry etching a material to be treated; and a heat-treatment unit directly conncted to said dry etching unit, said heat-treatment unit having a case whose opposite side walls are formed with an inlet for said material to be treated and an outlet for said treated material, respectively, a transportation means for transporting said material to be treated from said inlet to said outlet of said case, and a contact heating means which is disposed adjacent to said transportation means and which, in the case of heating, is raised to make substantial contact with at least one surface of said material being transported by said transportation means to heat said material under atmospheric pressure.

The above and other objects, effects, features and advantages of the present invention will become more apparent from the following description of the preferred embodiments thereof taken in conjunction with the accompanying drawings.

DETAILED DESCRIPTION OF THE INVENTION

First Embodiment

Figure 2:
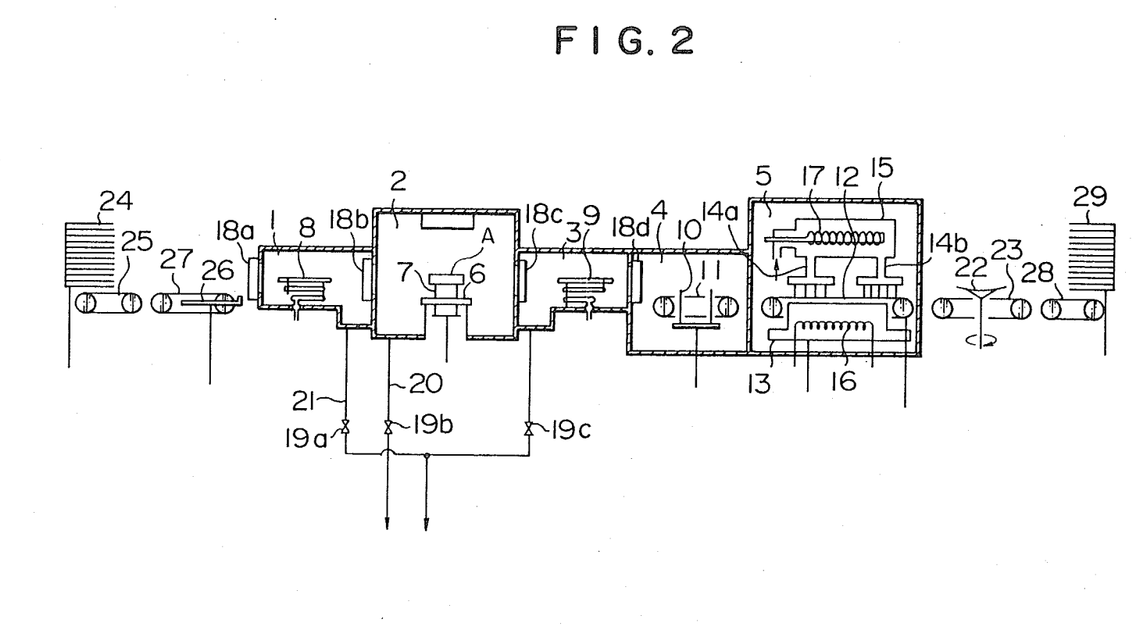
FIG. 2 is a longitudinal sectional view of a first embodiment of an apparatus for producing semiconductor devices according to the present invention.

Referring first to FIG. 2, a first embodiment of an apparatus for producing semiconductor devices according to the present invention comprises a load chamber 1, an etch chamber 2, an unload chamber 3, a buffer chamber 4, and a heat-treatment, or post-treatment chamber 5 which are arranged sequentially in the order named. An electrode 6 is disposed at a lower portion in the etch chamber 2 and pusher pins 7 which are disposed below the electrode 6 can vertically move through the electrode 6. Feeders 8 and 9 are disposed in the load and unload chambers 1 and 3, respectively, and each feeder 8 or 9 comprises two pairs of arms interconnected in the form of a pantagraph and a supporting plate at the top of the feeder 8 or 9. When the arms are rotated, a material to be treated; that is, a semiconductor wafer is linearly transported.

A belt conveyor 11 with pusher pins 10 is disposed within the buffer chamber 4 and a belt conveyor 12 is disposed within the heat-treatment chamber 5. A vertically movable hot plate 13 is disposed below the conveyor belt 12 in such a way that when the hot plate 13 is lifted to its uppermost position, the top surface of the hot plate 13 is higher than the top surface of the belt conveyor 12. A dryer 15 having two nozzles 14a and 14b is disposed above the conveyor belt 12. Heating elements 16 and 17 are disposed within the hot plate 13 and the dryer 15, respectively.

A gate valve 18a is disposed between the load chamber 1 and its exterior; a gate valve 18b is interposed between the load chamber 1 and the etch chamber 2; a gate valve 18c is interposed between the etch chamber 2 and the unload chamber 3; and a gate valve 18d is interposed between the unload chamber 3 and the buffer chamber 4. A gas introduction pipe 30 is connected to the etch chamber 2. The gas introduction pipe 30 introduces etching gases into the etch chamber 2. The etch chamber 2 communicates with an exhaust pipe 20 with a valve 19b while the load and unload chambers 1 and 3 communicate with an exhaust pipe 21 with valves 19a and 19c. The exhaust pipes 20 and 21 communicate with vacuum pumps (not shown).

A belt conveyor 23 with a water-rinse chuck 22, which is vertically movable and rotatable, is disposed at the downstream side of the heat-treatment chamber 5. A vertically movable load cassette 24, a conveyor belt 25 and a conveyor belt with a vertically movable setter 26 are disposed at the upstream side of the load chamber 1. A conveyor belt 28 and an unload cassette 29 are disposed at the downstream side of the water-rinse chuck 22.

Next, the mode of operation of the first embodiment with the above-described construction will be described. First, the load cassette 24 is lowered so that a material to be treated, or wafer A is placed upon the conveyor belt 25 so that the wafer A is transported at a position above the setter 26. Thereafter the wafer A is positioned at one end of the setter 26 and when the setter 26 is lifted, the wafer A is also lifted. At the same time, the gate valve 18a is opened and the feeder 8 is driven in such a way that the supporting plate thereof is located below the wafer A. Next the setter 26 is lowered so that the wafer A is placed on the supporting plate of the feeder 8 and moved into the load chamber 1.

Next, the gate valve 18 is closed and the load chamber 1 is evacuated through the exhaust pipe 21 and then the gate valve 18b of the etch chamber 2 is opened so that the wafer A is moved into the etch chamber 2. Thereafter the pusher pins 7 are lifted so that the wafer A is lifted above the supporting plate of the feeder 8. Next the feeder 8 returns to the load chamber 1 while the pusher pins 7 are lowered so that the wafer A is placed upon the electrode 6. Under these conditions, the wafer A is etched and after etching the pusher pins 7 are lifted so that the wafer A is also lifted. Then the gate valve 18c of the unload chamber 3 is opened and the supporting plate of the feeder 9 is located below the wafer A. As the pusher pins 7 are lowered, the wafer A is placed on the supporting plate of the feeder 9 and is moved into the unload chamber 3. Thereafter the gate valve 18c is closed while the gate valve 18d of the buffer chamber 4 is opened and the pusher pins 10 are moved upward so that the wafer A is lifted. After the feeder 9 has returned to the unload chamber 3, the pusher pins 10 are lowered so that the wafer A is placed on the conveyor belt 11. As the conveyor belt 11 is driven, the wafer A is moved into the heat-treatment chamber 5 and when the wafer A is located below the nozzle 14, the hot plate 13, which is heated by the heating element 16, is raised above the belt conveyor 12 so that the wafer A is transferred onto the top surface of the hot plate 13. In this case, the air which is heated by the heating element 17 is discharged through the nozzles 14a and 14b against the wafer A so as to dry the same. Thereafter the hot plate 13 is lowered and the conveyor belt 12 conveys the wafer A from the heat-treatment chamber to a position immediately above the water-rinse chuck 22. Next, the water-rinse chuck 22 is moved upward and attached to the rear surface of the wafer A. While the wafer A is rotated, pure water is discharged against the wafer A through a water-rinse nozzle (not shown) so that the wafer A is uniformly water rinsed. After the water-rinse treatment has been accomplished, the air is discharged through the same nozzle against the wafer A which is rotated at a high speed so that the wafer A is dried. After drying, the chuck 22 is lowered and the vacuum suction is released so that the wafer A is placed on the belt conveyor 23 and then transported by the conveyor 28 to the unload cassette 29.

As described above, according to the first embodiment, the post-treatment of the wafer can be immediately accomplished after the etching process so that corrosion of the wafer A can be effectively prevented.

Second Embodiment

Figure 3:
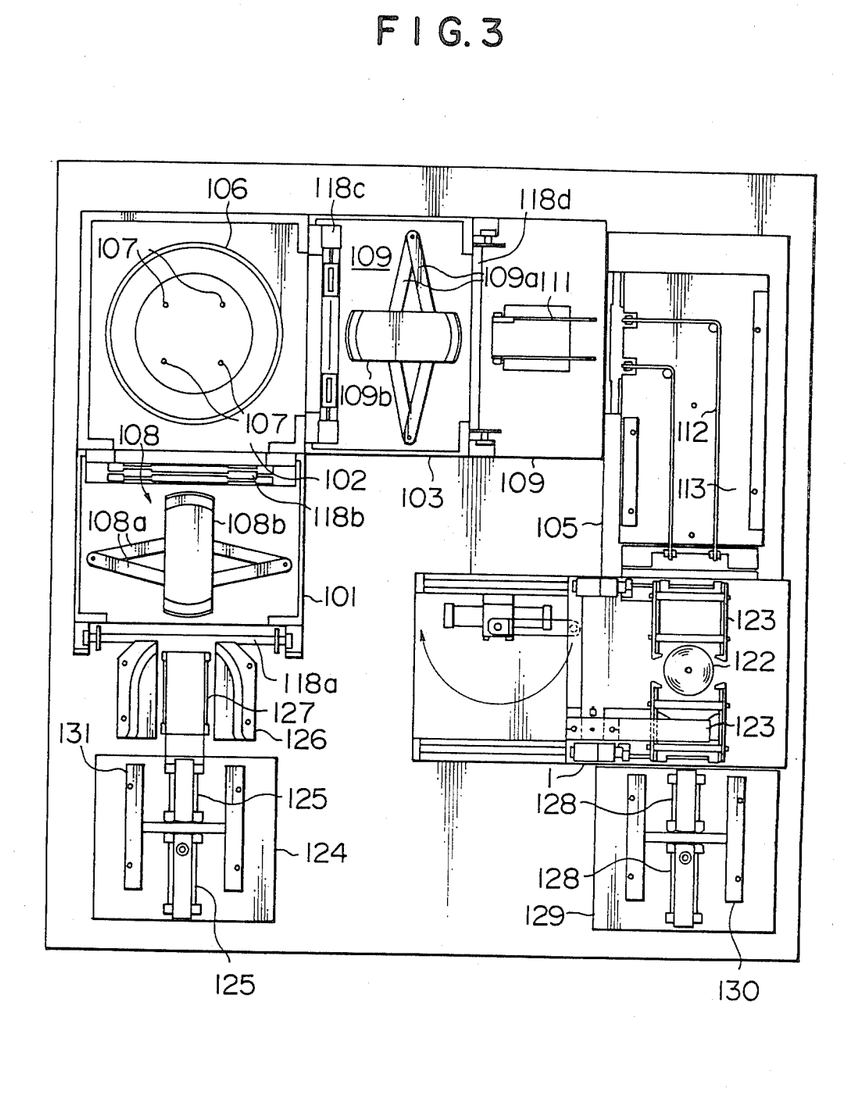
FIG. 3 is a sectional view of a second embodiment of the present invention.

A second embodiment of the present invention is shown in FIG. 2; while the chambers are connected linearly in the first embodiment, they are connected in the form of a U in the second embodiment so that the apparatus for producing semiconductor devices can be made compact in size and therefore the installation space can be minimized. That is, according to the second embodiment, a load chamber 101, an etch chamber 102, an unload chamber 103, a buffer chamber (transfer station or stage) 104 and a heat treatment chamber 105 are connected in the form of a U. The etch chamber 102 is connected to the load chamber 101 and the unload chamber 103 through gate valves 118b and 118c, respectively. One surface of the entrance and another surface of the exit of the heat treatment chamber 105 are adjacent to each other. The transfer stage 104 is communicated through an air valve 118d with the unload chamber 103 and is directly communicated with the heat-treatment chamber 105.

A water-rinse chuck 122 and a belt conveyor 123 are disposed at the downstream side of the heat treatment chamber 105 and a belt conveyor 128, an unload cassette 129 and an elevator 130 are disposed at the downstream side of the belt conveyor 123. A load cassette 124, an elevator 131, a belt conveyor 125, a setter 126 and a belt conveyor 127 are disposed at the upstream side of the load chamber 101. The load chamber 101 is communicates through an air valve 118a with the setter 127. A gas introduction pipe (not shown) which introduces etch gases into the etch chamber 102 is connected to the etch chamber 102.

An electrode 106 is disposed in the etch chamber 102 and pusher pins 107 are disposed below the electrode 106 in such a way that they are movable through the electrode 106. Feeders 108 and 109 are disposed in the load chamber 101 and the unload chamber 103. Each of the feeders comprises two pairs of arms 108a (109a) interconnected in the form of a pantagraph and a supporting plate 108b (109b) at the leading end of the feeder. When the arms are rotated, a wafer is transported linearly.

A belt conveyor 111 with pusher pins (not shown) is disposed within the transfer stage 104 and an L-shaped belt conveyor 112 is disposed in the heat treatment chamber 105. A vertically movable hot plate 113 is disposed below the belt conveyor 112 in such a way that when the hot plate 113 is lifted to its uppermost position, the top surface of the hot plate 113 is higher than the top surface of the belt conveyor 112.

Next the mode of operation of the second embodiment with the above-described construction will be described. The wafers in the load cassette 124 are moved one at a time by the conveyor belt 125 to the feeder assembly 108 within the load chamber 101. The load chamber gate valve 118a is then closed and the load chamber 101 is evacuated. The gate valve 118b between the etch and load chambers is opened and the wafer is placed on the etching cathode 106. The gate valve 118b is closed, reactive gases are introduced, the RF power supply is activated and etching is started. When the etching cycle has been completed, the etch chamber gate valves 118c are opend, the wafer is removed from the etch chamber 102 and transferred to the unload chamber 103. A new wafer is then loaded into the etch chamber 102.

The etched wafer is moved onto the transfer stage 104 and then into the passivation chamber 105 for treatment. After passivation, the etched wafer is transferred onto the water rinse/spin dry station for final passivation treatment. Finally the etched wafer is then transferred into the unload cassette 129 by the conveyor belt 128.

As described above, according to the second embodiment of the present invention, the post treatment chambers are sequentitally connected at the downstream side of the etch chamber so that the post treatments of the etched wafer can be accomplished immediately after the etching cycle. As a result, corrosion due to the reaction of the etched wafer with the surrounding atmosphere can be prevented. Furthermore, it is not needed to provide the post-treatment chambers independently of each other so that the installation space required can be minimized and the production efficiency can be improved.

In the first and second embodiments, the post treatments include the heat treatment and the water rinse/spin drying cleaning treatment, but it is to be understood that only the heat-treatment or the water rinse/spin drying cleaning treatment may be employed and that any other required post-treatments may succeed to the etching process.

Third Embodiment

Figure 4:
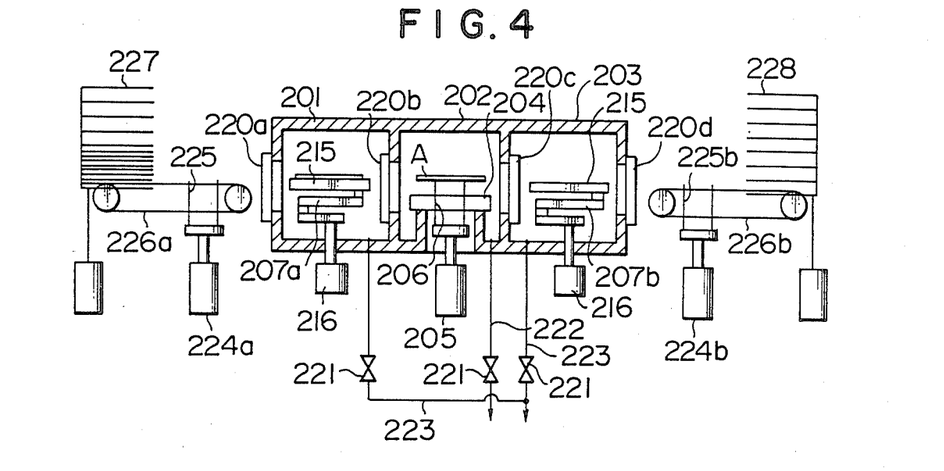
FIG. 4 is a longitudinal sectional view of a third embodiment of the present invention.

A third embodiment of the present invention is shown in FIG. 4 and has a first treatment chamber 201, a second treatment chamber 202 and a third treatment chamber 203 connected with each other in the order named. An electrode 204 is disposed at a lower portion of the second treatment chamber 202 and pusher pins 206 which are moved vertically by means of an air cylinder 205 are disposed below the electrode 204. Feeders 207a and 207b are disposed in the first and third treatment chambers 201 and 203, respectively.

Figure 5:
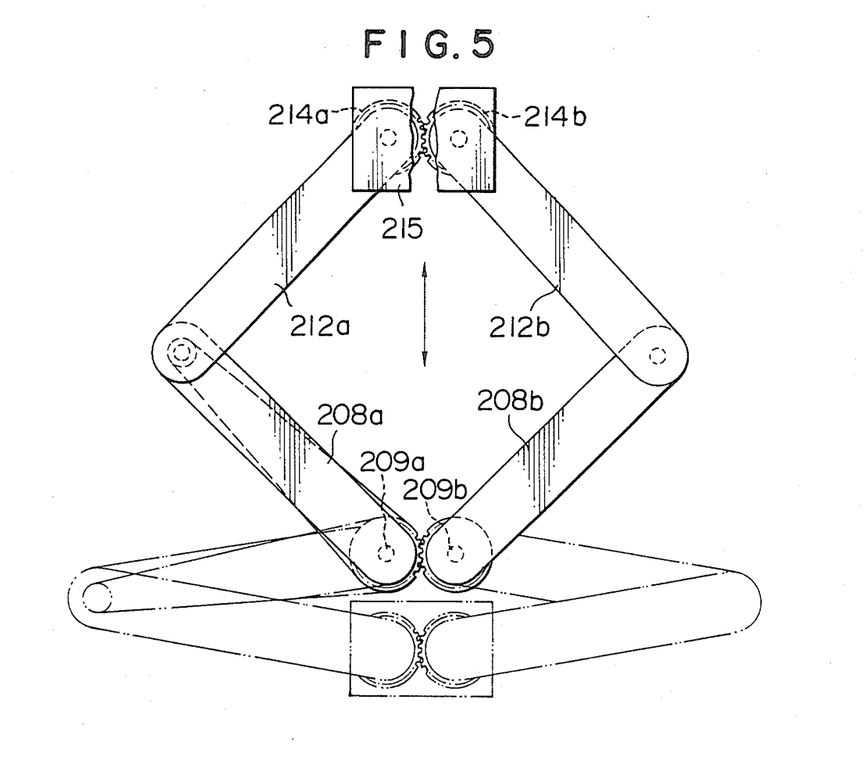
FIGS. 5 and 6 are a top view and a side view, respectively, of a transport device of the third embodiment shown in FIG. 4.
Figure 6:
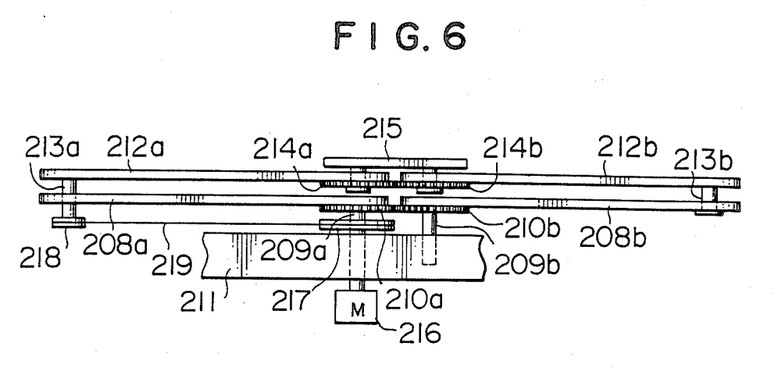

As shown in FIGS. 5 and 6, the feeder 207 includes two first arms 208a and 208b and the upper ends of driving shafts 209a and 209b securely joined to the lower surfaces at one end of the first arms 208a and 208b, respectively. These driving shafts 209a and 209b carry gears 210a and 210b, respectively. The first arms 208a and 208b are so disposed symmetrically that the gears 210a and 210b engage with each other. The driving shafts 209a and 209b are rotatably supported by a supporting base 211. The first arms 208a and 208b are symmetrically rotated about the axes of the driving shafts 209a and 209b, respectively.

One end of second arms 212a and 212b, which are equal in length to the first arms 208a and 208b, is connected through rotary shafts 213a and 213b to the other ends of the first arms 208a and 208b, respectively, so that the second arms 212a and 212b are rotated about the rotary shafts 213a and 213b, respectively, in parallel with the first arms 208a and 208b. Gears 214a and 214b are carried by the other ends of the second arms 212a and 212b, respectively, and the other ends of the second arms 212a and 212b are rotatably fixed to a wafer supporting plate 215 in such a way that the gears 214a and 214b mesh with each other.

In the third embodiment, one of the first arms 208a (the left arm in FIGS. 5 and 6) is extended through the supporting base 211 and connected to a rotary drive means such as an electric motor 216. A stationary wheel 217 is disposed on the supporting base 211 in coaxial relationship with the driving shaft 209a connected to the motor 216. A rotating wheel 218 whose diameter is one half of that of the stationary wheel 217, is carried at the lower end of the rotary shaft 213a of the second arm 212a connected to the first arm 208a. A belt 219 is wrapped around the stationary wheel 217 and the rotating wheel 218 so that the rotation of the first arm 208a is transmitted to the second arm 212a.

Therefore, when the motor 216 is energized so that the driving shaft 209a is rotated, the other driving shaft 209b rotates in the opposite direction because of the engagement of the gears 210a and 210b so that the first arms 208a and 208b rotate symmetrically. Upon rotation of the first arm 208a, the rotating wheel 218 is rotated so that the second arm 212a is rotated in the direction opposite to the direction in which the first arm 208a rotates and concurrently the second arm 212b is also rotated because of the engagement between the gears 214a and 214b. As a result, a wafer placed on the supporting plate 215 is transported linearly.

Referring back to FIG. 4. the first treatment chamber 201 communicates with the surrounding atmosphere through a gate valve 220a and with the second treatment chamber 202 through a gate valve 220b. The second treatment chamber 202 communicates through a gate valve 220c with the third treatment chamber 203 which in turn communicates with the surrounding atmosphere through a gate valve 220d. The first and third treatment chambers 201 and 203 communicates through valves 221 to an exhaust pipe 223 which in turn communicates with a vacuum pump (not shown). In like manner, the second treatment chamber 202 communicates through a valve 221 to an exhaust valve 222 which in turn communicates with a vacuum pump (not shown). Belt conveyors 226a and 226b are disposed adjacent to the gate valves 220a and 220d, respectively, of the first and third treatment chambers 201 and 203 and have pusher pins 225a and 225b, respectively, which are moved upward or downward by means of air cylinders 224a and 224b. A load cassette 227 is disposed at the upstream end of the belt conveyor 226a while an unload cassette 228 is disposed at the downstream end of the belt conveyor 226b.

Next, the mode of operation of the third embodiment with the above-described construction will be described. FIrst the load cassette 227 is lowered so that a wafer A is placed over the belt conveyor 226a which in turn moves the wafer A at a position immediately above the pusher pins 225a. Next, the belt conveyor 226a is stopped and the pusher pins 225a are lifted so that the wafer A is also raised. Next the gate valve 220a is opened and the feeder 207a is energized in such a way that the supporting plate 215 is located immediately below the wafer A. Thereafter the pusher pins 225a are lowered so that the wafer A is placed on the supporting plate 215 and is transferred into the first treatment chamber 201.

Next the gate valve 220b between the first and second treatment chambers 201 and 202 is opened so that the wafer A is transferred into the second treatment chamber 202. In this case, the pusher pins 206 are raised so that the wafer A is raised to a position above the supporting plate 215. Thereafter while the feeder 207a returns into the first treatment chamber 201, the pusher pins 206 are lowered so that the wafer A is placed upon the electrode 204. Under these conditions the wafer A is etched and upon completion of the etching cycle, the pusher pins 206 are again raised so that the wafer A is also raised. Next the gate valve 220c between the second and third treatment chambers 202 and 203 is opened and the supporting plate 215 of the feeder 207b is brought to a position immediately below the wafer A. Thereafter the pusher pins 206 are lowered so that the wafer A is transferred onto the supporting plate 215 of the feeder 207b. After the wafer A has been placed into the third treatment chamber 203, it is transferred onto the unload cassette 228 in reverse sequence to the transfer sequence described above.

In the third embodiment, the feeders 207a and 207b and the belt conveyors 226a and 226b are so designed and constructed that the wafers are transported in the opposite directions. Therefore, for instance, the wafer A which has once been placed into the first treatment chamber 201 can be returned to the load cassette 227. In this case, the quantity of dust which has adhered to the wafer in the first treatment chamber 201 can be measured by comparing the quantity of dust adhered to the wafer before the latter is placed into the first treatment chamber 201 with the quantity of dust adhered to the wafer after the latter is discharged out of the first treatment chamber 201. The quantity of dust adhered to a wafer can be measured with the aid of a microscope.

Furthermore, the wafer which has been placed into the second treatment chamber 202 can be returned to the load cassette 227 by means of the feeder 227a and the belt conveyor 226a. In this case, the quantity of dust adhered to the wafer in the second treatment chamber an be measured by subtracting from the quantity of dust adhered to the wafer returned to the load cassette 227 the quantity of dust adhered to the wafer before the latter was placed into the first treatment chamber 201 and the quantity of dust adhered to the wafer in the first chamber 201. In like manner, the quantity of dust adhered to the wafer in the third treatment chamber 203 can be measured. Furthermore, even when more than four treatment chambers are connected in series, the quantity of dust adhered to the wafer in each treatment chamber can be measured in a manner substantially similar to that described above.

So far the present invention has been described in connection with the etching apparatus, but it is to be understood that the present invention may be equally applied to other vacuum treatment devices such as sputtering devices, plasma CVD devices, vacuum evaporation devices and so on.

As described above, in the aparatus for producing semiconductor devices in accordance with the present invention, a wafer or a material to be treated which has been transferred into any desired treatment chamber can be returned to the entrance of the apparatus. Therefore, the quantity of dust adhered to a wafer in a specific treatment chamber can be easily and correctly measured by comparing the quantity of dust originally adhered to the wafer before is was placed into the apparatus with the quantity of dust adhered to the wafer discharged from said specific treatment chamber of the apparatus. Therefore, the quantity of dust or contaminants produced in each treatment chamber can be measured so that suitable countermeasures can be taken to avoid contamination of a wafer in each treatment chamber. As a result, a high yield can be ensured and the production efficiency can be improved.

Fourth Embodiment

Figure 7:
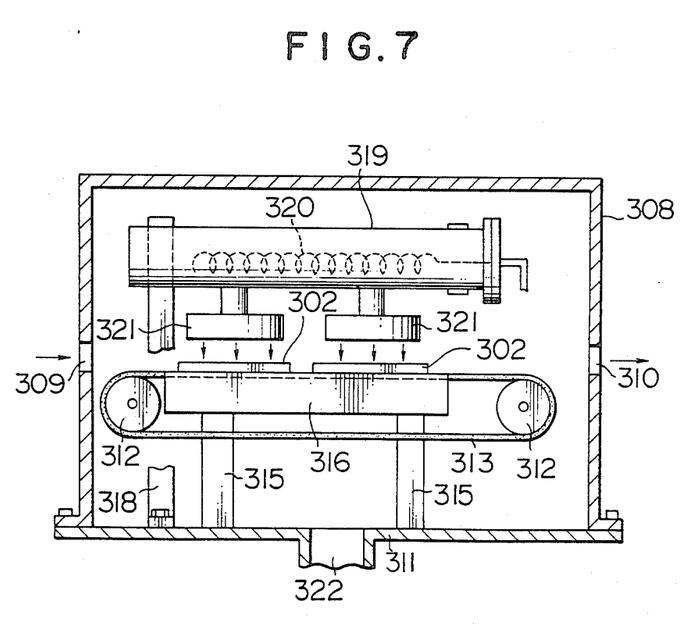
FIGS. 7 and 8 are a longitudinal sectional view and an end view, respectively, of a heat-treatment device incorporated in a fourth embodiment of the present invention.
Figure 8:
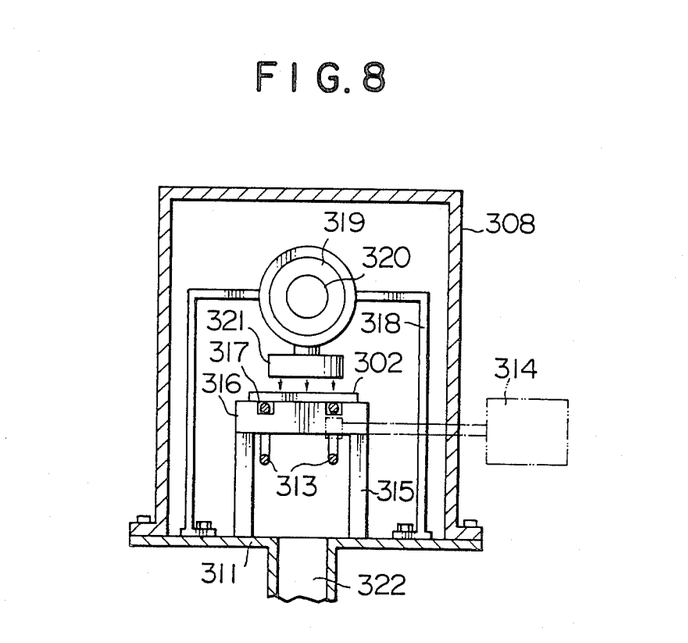
Figure 9:
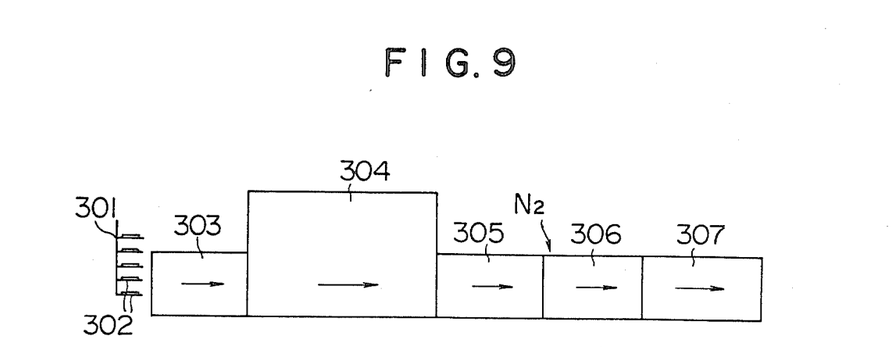
FIG. 9 is a schematic side view of the fourth embodiment of the present invention.

A fourth embodiment of the present invention is shown in FIGS. 7–9. One example of the etching processes utilizing chloride gases is shown in FIG. 9. Wafers 302 from a wafer cassette 301 are placed one at a time into a load lock chamber 303 which is alternately maintained at an atmospheric pressure and a vacuum pressure. When the load lock chamber 303 is evacuated, the wafers are transferred into a vacuum etch chamber 304 for treatment. Upon completion of an etching cycle, they are transferred into a load lock chamber 305 and when the load lock chamber 305 is maintained at an atmospheric pressure, the wafers are transferred into an $N_2$-gas chamber 306 to prevent the oxidation of the wafers. Thereafter, they are transferred into a post treatment chamber for water rinsing or heat-treatment. The $N_2$-gas chamber 306 is provided in order to avoid the corrosion of the wafers due to the reaction with water in the air. In the case of this process, the device or chamber 307 for effecting the heat-treatment of wafers is the last stage so that it succeeds to the $N_2$-gas chamber 306.

Referring back to FIG. 7, a box-shaped case 308 has a wafer charging inlet 309 formed through the left wall and a wafer discharge outlet 310 formed through the right wall, the height of the wafer charging inlet 309 being euqal to that of the wafer discharge outlet 310.

A pair of belt wheels 312 are supported by a frame 311 in the case 308 and a pair of endless belts circular in cross section are wrapped around the belt wheels 312 and spaced apart from each other by a suitable distance in the widthwise direction. The height of the endless belts 313 is equal to the height of the lower sides of the wafer charging inlet 309 and the wafer discharge outlet 310 so that a wafer 302 charged through the wafer charging inlet 309 is transferred onto the endless belts 313 and is transported toward the wafer discharge outlet 310.

The endless belts 313 are driven by a motor 314 (See FIG. 8) through a suitable power transmission mechanism (not shown).

A heating plate 316 is supported by insulation members 315 which in turn are erected from the frame 311. The heating plate 316 is located adjacent to the undersurface of the upper run of the endless belt 313 and the top surface of the heating plate 316 is formed with a pair of grooves 317 whose width is greater than the diameter of the endless belts 313 so that the upper surface of the heating plate 316 is maintained as close as possible to the wafer 302 on the endless belts 313 or is maintained in contact with the wafer 302. The heating plate 316 heats the undersurface of the wafer 302.

Heating means or hot air blowing cylinder 319 is supported by a frame 318 in opposed relationship with the top surface of the endless belts 313 and a heating element 320 such as a coil of nicrome wire is disposed within the cylinder 319. The hot air blowing cylinder 319 has blow-off openings 321 extended downward and spaced apart from the upper surface of the wafer 302 by a suitable distance. Therefore the air heated in the cylinder 319 is discharged through the blow-off openings 321 against the upper surface of the wafer 302.

An air discharge port 322 is extended downwardly from the bottom of the box-shaped case 308 and is communicated with the surrounding air.

Next the mode of operation of the fourth embodiment with the above-described construction will be described. In the etching process, the wafer 302 which has been etched in the etch chamber 304 is transferred into the load lock chamber 305 and then into the $N_2$-gas chamber 306. The wafer 302 in the chamber 306 is inserted through the charging inlet 309 into the box-shaped case 308 and placed upon the endless belts 313.

Upon rotation of the motor 314, the wafer 302 is transported by the endless belts 313 toward the discharge outlet 310. During this time, the heating plate 316 heats the undersurface of the wafer 302 while the hot air is discharged from the hot-air-blow-off cylinder 319 against the upper surface of the wafer 302, whereby the compounds resulting from the reactions between the wafer 302 and the chloride gases in the $N_2$gas chamber 306 are removed. The hot air is discharged through the discharge port 322.

After the completion of one heat-treatment cycle, the endless belts 313 are driven again so that the succeeding wafers are sequentially brought to the heat-treatment position. Thus the heat-treatment of wafers can be continuously carried out.

So far the endless belts 313 have been described as having a circular cross sectional configuration, but it is to be understood that the present invention is not limited thereto and that the endless belts may have a polygonal cross sectional configuration. Furthermore, instead of a pair of endless belts, a single wide and flat endless belt having a plurality of holes spaced apart from each other along the center line of the belt may be used.

As described above according to the fourth embodiment of the present invention, the heating plate is maintained in contact with or almost in contact with the undersurface of the wafer while the hot air is discharged against the upper surface of the wafer so that the heat-treatment of the wafer can be accomplished uniformly in a short period of time. As a result, the problem of non-uniform temperature distribution in the prior art can be overcome. Furthermore the heat-treatment chamber can be connected in series to the etch chamber so that the wafers can be transported one at a time sequentially throughout the treatment chambers so that, as compared with the prior art lot or batch processing systems, the treatment efficiency can be remarkably improved.

So far the wafers have been described as being heated by the hot air discharged from the hot-air-blow-off cylinder and the heat plate, but it is to be understood that the wafers can be heated only by the hot air or by the heating plate.

Fifth Embodiment

Figure 10:
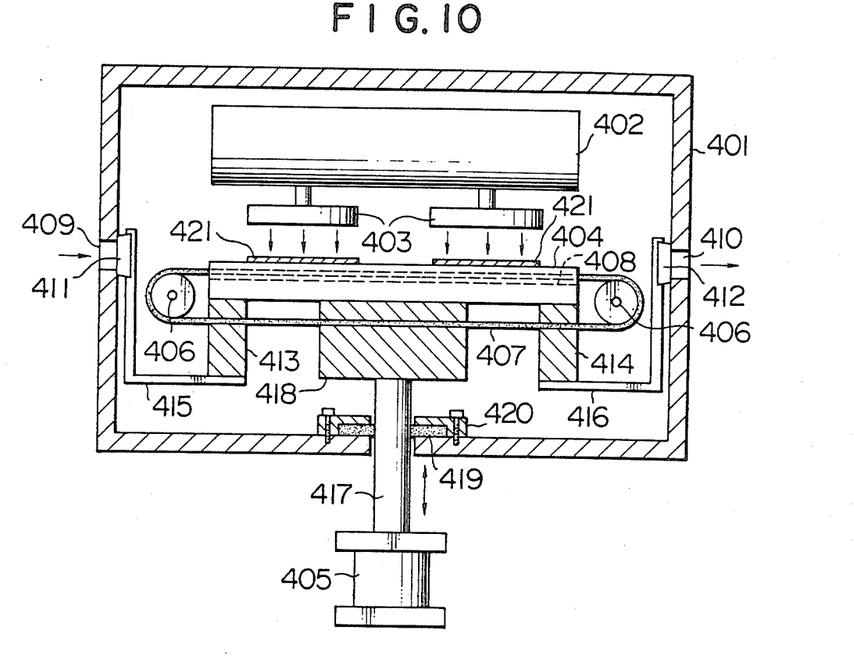
FIG. 10 is a longitudinal sectional view of a heat-treatment device incorporated in a fifth embodiment of the present invention.

FIG. 10 shows a heat-treatment device incorporated in a fifth embodiment of an apparatus for producing semiconductor devices according to the present invention. An air-heating device 402 which is disposed at an upper portion of a closed treatment chamber 401 has hot-air discharge openings extended from the bottom of the air-heating device 402 and opened downwardly. The hot air heated in the air-heating device 402 is discharged downwardly through the hot air discharge openings 403.

A heating plate 404 which is disposed immediately below the hot air discharge openings 403 is vertically movable by means of an air cylinder 405 or driving means disposed outside of the closed heat-treatment chamber 401. It is to be understood that instead of the air cylinder 405 any other suitable driving means such as a crank mechanism can be used.

The upper surface of the heating plate 404 is formed with two grooves 408 extended in the longitudinal direction thereof and the upper runs of at least a pair of endless belts 407 (which is a wafer transport means) which are wrapped around belt wheels 406 disposed at both ends of the heating plate 404, are fitted into these grooves 408. The depth of the grooves 408 is so selected that the upper surface (upon which are placed wafers) of the heating plate 404 can be raised above the upper surfaces of the endless belts 407 and lowered below the upper surfaces of the endless belts 407.

Disposed in an opposed relationship with both ends of the heating plate 404 are shutters 411 and 412 which are adapted to open or close a wafer inlet 409 and a wafer outlet 410, respectively. The shutters 411 and 412 are made of a fluoro plastic and are securely attached to arms 415 and 416, respectively, which in turn are connected to the lower ends of heat-insulating members 413 and 414, respectively, depending from the lower surface of the heat plate 404. Therefore, when the heat plate 404 is raised, the shutters 411 and 412 close the wafer inlet and outlets 409 and 410, but when the heat plate 404 is lowered, the shutters 411 and 412 open the wafer inlet and outlet 409 and 410.

A power transmission shaft 417 extended upwardly from the air cylinder 405 through the bottom of the heating chamber 401 is securely joined to the lower end of a heat-insulating member 418 depending from the lower surface of the heating plate 404. A ring member 419 made of a material such as fluoro plastic which will not chemically react with etching gases produced in the closed heat-treatment chamber 401, is fitted over the shaft 417 and made into contact with the bottom of the heat-treatment chamber 401 and is securely held in position by means of a retainer 420 in such a way that any gap between the shaft 417 and the bottom of the heat-treatment chamber 401 is eliminated and the free vertical movement of the shaft 417 is permitted.

Next the mode of operation of the fith embodiment with the above-described construction will be described. In order to place a wafer 421 into the heat-treatment chamber 401, the heating plate 404 is lowered so that the shutters 411 and 412 are also lowered, opening the wafer inlet and outlet 409 and 410. As the heating plate 404 is lowered, the upper-run surfaces of the endless belts 407 are raised above the upper surface of the heating plate 404 and the wafer 421 is transferred onto the endless belts 307. When the wafer 421 is transported through the heat-treatment chamber 401 and reaches a predetermined position, it is stopped by means of stoppers (not shown) so that it is located immediately below the hot air discharge opening 403. Thereafter the heating plate 404 is raised above the upper-run surfaces of the endless belts 407 so that the wafer 421 is transferred onto the heating plate 404 thereby making intimate contact with the upper surface thereof. As the heating plate 404 is raised, the shutters 411 and 412 are also raised, thus closing the wafer inlet 409 and 410. Thus the interior of the heat-treatment chamber 401 is kept air-tight and the hot air heated in the air-heating device 402 is discharged through the hot air discharge opening 403 against the wafer 421 for treatment.

Upon completion of the heat-treatment cycle, the heating plate 404 is lowered so that the wafer 421 which has been placed upon the upper surface of the heating plate 404 is not transferred onto the upper-run surfaces of the endless belts 417 and is transported. As the heating plate 404 is lowered, the shutters 411 and 412 are also lowered, opening the wafer inlet and outlet 409 and 410. Therefore while the treated wafer 421 is discharged through the wafer outlet 410 out of the closed treatment chamber 401, a new wafer is transported through the wafer inlet 409 and transferred onto the endless belts 407. Thereafter the new wafer 421 is subjected to the heat-treatment cycle in the manner described above.

Figure 11:
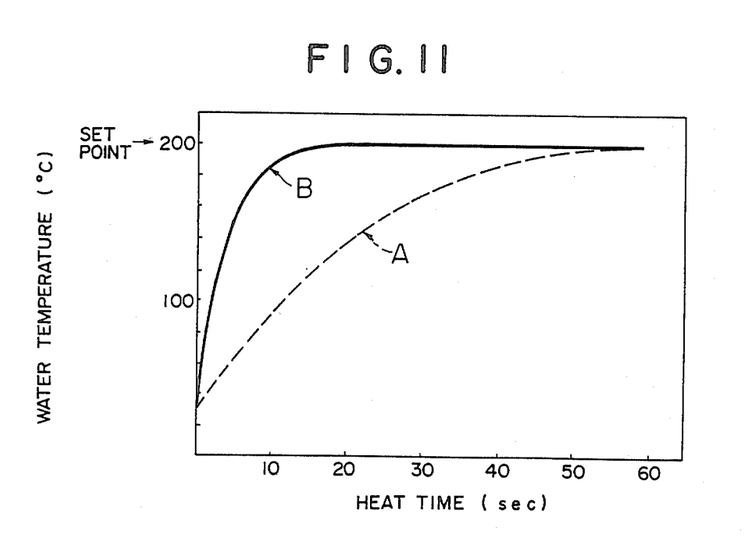
FIG. 11 shows a time-temperature characteristic curve of the heat-treatment device shown in FIG. 10 in comparison with the time-temperature characteristic curve of a prior art heat-treatment device.

As described above, according to the fifth embodiment, the wafers are automatically transported into and discharged out of the closed heat-treatment chamber and in the heat-treatment chamber the wafers are subjected to the heat-treatment cycle by both the hot air discharged from the hot-air discharge openings and the heating plate. The heating plate is vertically movable between a position at which the upper surface (upon which is placed a material to be treated) of the heating plate is higher than the upper surface of the transport mechanism and a position at which the upper surface of the heating plate is lower than the upper surface of the transport mechanism. When the heating plate is raised, a wafer on the transport mechanism is transferred onto the upper surface of the heating plate thereby making contact therewith so that the wafer is heated. Thus, the contact of the wafer with the upper surface of the heating plate can be easily and positively effected so that, as shown in FIG. 11, the wafer heat-treatment by the present invention (indicated by the solid-line curve B) occurs about three times as fast as the wafer heat-treatment by the prior art (indicated by the broken-line curve A). Thus the heat-treatment capacity can be remarkably improved.

So far the wafer heat-treatment has been described as being effected by both the hot air discharge through the hot-air discharge openings and the heating plate, but it is to be understood that the wafer heat-treatment can be effected only by the heating plate. Furthermore, the shutters 411 and 412 may be opened or closed by an independent mechanism, not by the mechanism for vertically moving the heating plate 404.

Sixth Embodiment

Figure 12:
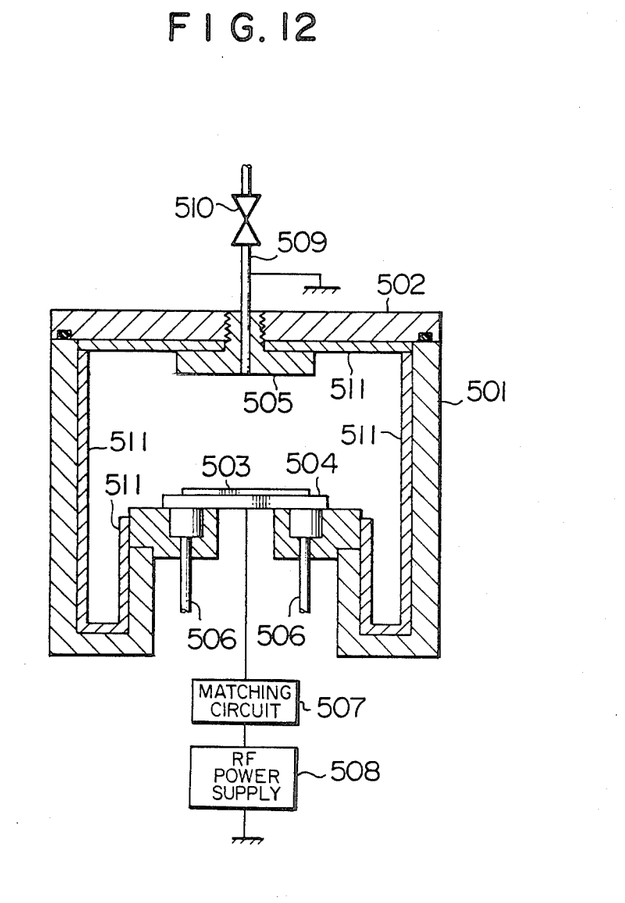
FIG. 12 is a vertical sectional view of a sixth embodiment of the present invention.

FIG. 12 shows an RIE device incorporated in a sixth embodiment of the apparatus for producing semiconductor devices in accordance with the present invention. The top of a vacuum chamber 501 made of a stainless steel is air-tightly closed by a detachable cover 502 and a lower electrode 504 upon which is placed a wafer 503 is disposed on the bottom of the vacuum chamber 501. An upper electrode 505 which is grounded is securely attached to the undersurface of the detachable cover 502 by means of screws in opposed relationship with the lower electrode 504. The lower surface of the lower electrode 504 communicates with cooling-water pipes 506 and the lower electrode 504 is connected through a matching circuit 507 to an RF power supply 508. A gas inlet pipe 509 with a valve 510 is extended through the upper electrode 505 to introduce the etching gases into the vacuum chamber 501. Aluminum linings 511, 2-3 mm in thickness, cover the inner wall surfaces of the vacuum chamber 501. These linings are divided into those which cover the side wall surfaces and the bottom and those which cover the undersurface of the cover 502 and which are securely interposed between the upper electrode 505 and the undersurface of the cover 502 when the upper electrode 505 is screwed into the detachable cover 502.

Therefore, according to the sixth embodiment, even when chloride etching gases are used, the linings 511 can positively prevent the wafer 502 from being contaminated with iron, nickel and the like produced from the stainless steel component parts. In order to clean the interior of the vacuum chamber 501, the cover 502 is removed and the linings 511 are detached so that a period of time during which the interior of the vacuum chamber 501 is exposed to the surrounding atmosphere can be shortened. When new linings are prepared, the etching process can be started again only by replacing the old linings 511 with new ones. Instead of the aluminum linings 511, linings made of any other suitable materials such as carbon, silicon carbide and the like may be used.

As described above, the inner wall surfaces of the vacuum vessel of the plasma etching device in accordance with the present invention are lined with the aluminum linings which are detachable so that even when the vacuum chamber is made of stainless steel and chloride etching gases are used, the contamination of wafers can be positively prevented. Furthermore, the maintenance such as cleaning can be carried out in a simple manner only by detaching the aluminum linings. Moreover, economical advantages can be obtained.

What is claimed is:

1. An apparatus for producing semiconductor devices comprising:
    a dry etching unit for dry etching a material to be treated, said dry etching unit having an etching chamber in which said material to be treated is etched, an electrode for applying RF power to said material to be treated which is securely held in position, a gas introduction means for introducing etching gases into said etching chamber, a loading chamber communicating with said etching chamber for transferring the material to be treated into said etching chamber, and an unloading chamber communicating with said etching chamber for transferring the material to be treated from said etching chamber into said unloading chamber;
    a heat-treatment unit for heat treating said material dry-etched, said heat-treatment unit having a transfer chamber communicating with said unloading chamber of said dry etching unit for transferring the material to be treated from said unloading chamber, a heat-treatment chamber communicating with said transfer chamber, and heating means disposed in said heat-treatment chamber for heating the material to be treated; and
    a water cleaning unit with a chuck for cleaning said material heat-treated with water while said chuck holds in position and rotates said material.

2. An apparatus as set forth in claim 1, further comprising:
    a load cassette disposed at the inlet side of said loading chamber for holding a plurality of materials to be treated;
    a first conveyor belt for transferring said material to be treated from said load cassette into said loading chamber;
    a second conveyor belt disposed at the outlet side of said water cleaning unit for transporting said treated materials one at a time; and
    an unload cassette for holding the treated materials transported by said second conveyor belt.

3. An apparatus as set forth in claim 1, wherein
    one side wall of said loading chamber is directly connected to one side wall of said etching chamber;
    one side wall of said unloading chamber is connected to the side wall adjacent to said one side wall of said etching chamber;
    one side wall of said transfer chamber is connected to the side wall opposite to said one side wall of said unloading chamber;
    one side wall of said heat-treatment chamber is connected to the side wall opposite to said one side wall of said transfer chamber; and
    said water cleaning unit is connected to the side wall adjacent to said one side wall of said heattreatment chamber.

4. An apparatus as set forth in claim 2, wherein
    one side wall of said etching chamber is connected to the side wall opposite to the inlet side wall of said loading chamber;
    one side wall of said unloading chamber is connected to the side wall adjacent to said one side wall of said etching chamber;
    one side wall of said transfer chamber is connected to the side wall opposite to said one side wall of said unloading chamber;
    one side wall of said heat-treatment chamber is connected to the side wall opposite to said one side wall of said transfer chamber; and
    the side wall opposite to said inlet side wall of said water cleaning unit is connected to the side wall adjacent to said one side wall of said heat-treatment chamber,
    whereby said inlet side wall of said loading chamber and the outlet side wall of said water cleaning unit are directed in the same direction.

5. An apparatus for producing semiconductor devices comprising:
    a dry etching unit for dry etching a material to be treated, said dry etching unit having an etching chamber in which said material to be treated is etched, an electrode for applying RF power to said material to be treated which is securely held in position and a gas introduction means for introducing etching gases into said etching chamber;

a heat-treatment unit having a contact heating means for making substantial contact with at least one surface of said material etched in said dry etching unit thereby to heat said material under atmospheric pressure; and a transport means for transferring said material to be heated from said dry etching unit to said heat-treatment units, said transport means connected to said dry etching unit and said heat-treatment unit.

6. An apparatus as set forth in claim 5, further comprising a water cleaning unit with a chuck for cleaning said heat-treated material with water while said chuck holds in position and rotates said material.

7. An apparatus for producing semiconductor devices comprising:

a dry etching unit for dry etching a material to be treated, said dry etching unit having an etching chamber in which said material to be treated is etched, an electrode for applying RF power to said material to be treated which is securely held in position and a gas introduction means for introducing etching gases into said etching chamber;

a heat-treatment unit having a hot air blowing means for blowing hot air against at least one surface of said material etched in said dry etching unit thereby to heat said material under atmospheric pressure;

a transport means for transferring said material to be heated from said dry etching unit to said heat-treatment unit, said transport means connected to said dry etching unit and said heat-treatment unit.

8. An apparatus as set forth in claim 7, further comprising a water cleaning unit with a chuck for cleaning said heat-treated material with water while said chuck holds in position and rotates said material.

9. An apparatus for producing semiconductor devices comprising:

a plurality of treatment chambers for effecting a plurality of sequential treatments on a material to be treated, said plurality of treatment chambers being arranged in order of said sequential treatments; and a conveyor means for transporting said material to be treated through said plurality of treatment chambers in one direction or in the opposite direction, whereby said material to be treated which has been transported in one direction by said conveyor means through part of said plurality of treatment chambers can be transported in the opposite direction through said part of the plurality of treatment chambers, so that said material on which only part of said plurality of sequential treatments has been effected can be taken out from the inlet of said plurality of treatment chambers.

10. An apparatus as set forth in claim 9, further comprising:

a load cassette disposed at the inlet side of said plurality of treatment chambers for holding a plurality of materials to be treated;

a first conveyor belt for transferring said materials to be treated, which is held in said unload cassette, one at a time;

a second conveyor belt disposed at the outlet side of said plurality of treatment chambers for transferring one of said treated materials at a time; and an unload cassette for holding the treated materials transferred by said second conveyor belt.

11. An apparatus as set forth in claim 9, wherein one of said plurality of treatment chambers is an etching chamber in which said material to be treated is etched.

12. An apparatus as set forth in claim 9, wherein at least one of said plurality of treatment chambers is a sputtering chamber in which said material to be treated is sputtered.

13. An apparatus as set forth in claim 9, wherein at least one of said plurality of treatment chambers is a CVD chamber in which a film is formed on said material to be treated by the gas-hase growth resulting from chemical reactions.

14. An apparatus as set forth in claim 9, wherein at least one of said plurality of treatment chamber is an ion implantation chamber in which impurity ions or dopants are implanted into said material to be treated.

15. An apparatus as set forth in claim 10, wherein at least one of said plurality of treatment chambers is an etching chamber in which said material to be treated is etched.

16. An apparatus as set forth in claim 10, wherein at least one of said plurality of treatment chambers is a sputtering chamber in which said material to be treated is sputtered.

17. An apparatus as set forth in claim 10, wherein at least one of said plurality of treatment chambers is a CVD chamber in which a film is formed on said material to be treated by the gas phase growth resulting from chemical reactions.

18. An apparatus as set forth in claim 10, wherein at least one of said plurality of treatment chambers is an ion implantation chamber in which impurity ions or dopants are implanted into said material to be treated.

19. An apparatus for producing semiconductor devices comprising:

a dry etching unit for dry etching a material to be treated; and a heat-treatment unit communicating with said dry etching unit, said heat-treatment unit having a case whose opposing side walls are formed with an inlet for said material to be treated and an outlet for said treated material, a transporting means for transporting said material to be treated from said inlet to said outlet of said case, and a heating means disposed adjacent to said transporting means for heating under atmospheric pressure said material which is transported by said transporting means, said heating means having a contact heating means for making substantial contact with at least one surface of the material.

20. An apparatus for producing semiconductor devices comprising:

a dry etching unit for dry etching a material to be treated; and a heat-treatment unit communicating with said dry etching unit, said heat-treatment unit having a case whose opposing side walls are formed with an inlet for said material to be treated and an outlet for said treated material, a transporting means for transporting said material to be treated from said inlet to said outlet of said case, and a heating means disposed adjacent to said transporting means for heating under atmospheric pressure said material which is transported by said transporting means, said heating means having a hot air blowing means for blowing hot air against at least one surface of said material.

21. An apparatus for producing semiconductor devices comprising:
a dry etching unit for dry etching a material to be treated; and
a heat-treatment unit communicating with said dry etching unit, said heat-treatment unit having a case whose opposing side walls are formed with an inlet for said material to be treated and an outlet for said treated material, a transporting means for transporting said material to be treated from said inlet to said outlet of said case, and a heating means disposed adjacent to said transporting means for heating under atmospheric pressure said material which is transported by said transporting means, said heating means having a contact heating means for making substantial contact with at least one surface of said material and a hot air blowing means for blowing hot air against at least another surface of said material.

22. An apparatus for producing semiconductor devices comprising:
an etching unit for dry etching a material to be treated; and
a heat-treatment unit directly connected to said dry etching unit, said heat-treatment unit having a case whose opposing side walls are formed with an inlet for said material to be treated and an outlet for said treated material, respectively, a transportation means for transporting said material to be treated from said inlet to said outlet of said case, and a hot air blowing means which is disposed adjacent to said transportation means and which blows hot air against said material being transported by said transportation means to heat said material under atmospheric pressure.

23. An apparatus as set forth in claim 22, wherein said heat-treatment unit further includes shutter means which open or close said inlet and outlet of said case in response to the vertical movement of said contact heating means.

24. An apparatus for producing semiconductor devices comprising:
an etching unit for dry etching a material to be treated; and
a heat-treatment unit directly connected to said dry etching unit, said heat-treatment unit having a case whose opposite side walls are formed with an inlet for said material to be treated and an outlet for said treated material, respectively, a transportation means for transporting said material to be treated from said inlet to said outlet of said case, and a contact heating means which is disposed adjacent to said transportation means and which, in the case of heating, is raised to make substantial contact with at least one surface of said material being transported by said transportation means to heat said material under atmospheric pressure.

25. An apparatus as set forth in claim 24, wherein said heat-treatment unit further includes shutter means which open or close said inlet and outlet of said case in response to the vertical movement of said contact heating means.

26. An apparatus for producing semiconductor devices comprising:
an etching unit for dry etching a material to be treated; and
a heat-treatment unit directly connected to said dry etching unit, said heat-treatment unit having a case whose opposing side walls are formed with an inlet for said material to be treated and an outlet for said treated material, respectively, a transportation means for transporting said material to be treated from said inlet to said outlet of said case, a contact heating means which is disposed adjacent to said transportation means and which, in the case of heating, is raised to make substantial contact with at least one surface of said material being transported by said transportation means, and a hot air blowing means which is disposed adjacent to said transportation means and which blows hot air against said material whereby said contact heating means and said hot air blowing means heat said material under atmospheric pressure.

27. An apparatus as set forth in claim 26, wherein said heat-treatment unit further includes shutter means which open or close said inlet and outlet of said case in response to the vertical movement of said contact heating means.

28. An apparatus for producing semiconductor devices comprising:
a dry etching unit for dry etching a material to be treated, said dry etching unit having an etching chamber in which said material to be treated is etched, an electrode for applying RF power to said material to be treated which is securely held in position and a gas introduction means for introducing etching gases into said etching chamber;
a heat-treatment unit having a contact heating means for making substantial contact with at least one surface of said material etched in said dry etching unit and a hot air blowing means for blowing hot air against at least another surface of said material, whereby said material is heated under atmospheric pressure; and
a transport means for transferring said material to be heated from said dry etching unit to said heat-treatment unit, said transport means connected to said dry etching unit and said heat-treatment unit.

29. An apparatus as set forth in claim 28, further comprising a water cleaning unit with a chuck for cleaning said heat-treated material with water while said chuck holds in position and rotates said material.

30. An apparatus as set forth in claim 9,
said conveyor means having two carrying units, each of which comprises:
a first arm mounted on a supporting base and adapted to be rotatable about one end thereof by a rotary drive means;
a second arm rotatably attached to the other end of said first arm;
a stationary wheel disposed on said supporting base coaxially with a rotary shaft of said first arm;
a rotary wheel attached to a rotary shaft of said second arm connected to said first arm; and
a belt provided between said stationary wheel and said rotary wheel,
the two carrying units being symmetrically arranged, respective first arms being adapted to be symmetrically rotatable through a gear, respective second arms being interconnected at the ends thereof by a supporting plate.

31. An apparatus as set forth in claim 30, wherein said first arm and said second arm are made equal in length to each other; and the ratio of the diameter of said stationary wheel to that of said rotary wheel is determined to be 2:1.

32. An apparatus as set forth in claim 10, said conveyor means having two carrying units, each of which comprises:
   a first arm mounted on a supporting base and adapted to be rotatable about one end thereof by a rotary drive means;
   a second arm rotatably attached to the other end of said first arm;
   a stationary wheel disposed on said supporting base coaxially with a rotary shaft of said first arm;
   a rotary wheel attached to a rotary shaft of said second arm connected to said first arm; and
   a belt provided between said stationary wheel and said rotary wheel,
   the two carrying units being symmetrically arranged, respective first arms being adapted to be symmetrically rotatable through a gear, respective second arms being interconnected at the ends thereof by a supporting plate.

33. An apparatus as set forth in claim 32, wherein said first arm and said second arm are made equal in length to each other; and the ratio of the diameter of said stationary wheel to that of said rotary wheel is determined to be 2:1.

34. An apparatus as set forth in claim 30, wherein one of said plurality of treatment chambers is an etching chamber in which said material to be treated is etched.

35. An apparatus as set forth in claim 30, wherein at least one of said plurality of treatment chambers is a sputtering chamber in which said material to be treated is sputtered.

36. An apparatus as set forth in claim 30, wherein at least one of said plurality of treatment chambers is a CVD chamber in which a film is formed on said material to be treated by the gas-phase growth resulting from chemical reactions.

37. An apparatus as set forth in claim 30, wherein at least one of said plurality of treatment chambers is an ion implantation chamber in which impurity ions or dopants are implanted into said material to be treated.

38. An apparatus as set forth in claim 31, wherein one of said plurality of treatment chambers is an etching chamber in which said material to be treated is etched.

39. An apparatus as set forth in claim 31, wherein at least one of said plurality of treatment chambers is a sputtering chamber in which said material to be treated is sputtered.

40. An apparatus as set forth in claim 31, wherein at least one of said plurality of treatment chambers is a CVD chamber in which a film is formed on said material to be treated by the gas-phase growth resulting from chemical reactions.

41. An apparatus as set forth in claim 31, wherein at least one of said plurality of treatment chambers is an ion implantation chamber in which impurity ions or dopants are implanted into said material to be treated.

42. An apparatus as set forth in claim 32, wherein one of said plurality of treatment chambers is an etching chamber in which said material to be treated is etched.

43. An apparatus as set forth in claim 32, wherein at least one of said plurality of treatment chambers is a sputtering chamber in which said material to be treated is sputtered.

44. An apparatus as set forth in claim 32, wherein at least one of said plurality of treatment chambers is a CVD chamber in which a film is formed on said material to be treated by the gas-phase growth resulting from chemical reactions.

45. An apparatus as set forth in claim 32, wherein at least one of said plurality of treatment chambers is an ion implantation chamber in which impurity ions or dopants are implanted into said material to be treated.

46. An apparatus as set forth in claim 33, wherein one of said plurality of treatment chambers is an etching chamber in which said material to be treated is etched.

47. An apparatus as set forth in claim 33, wherein at least one of said plurality of treatment chambers is a sputtering chamber in which said material to be treated is sputtered.

48. An apparatus as set forth in claim 33, wherein at least one of said plurality of treatment chambers is a CVD chamber in which a film is formed on said material to be treated by the gas-phase growth resulting from chemical reactions.

49. An apparatus as set forth in claim 33, wherein at least one of said plurality of treatment chambers is an ion implantation chamber in which impurity ions or dopants are implanted into said material to be treated.

* * * * *